United States Patent
Hsu et al.

(10) Patent No.: US 11,949,378 B2
(45) Date of Patent: Apr. 2, 2024

(54) CRYSTAL OSCILLATOR AND OSCILLATING DEVICE

(71) Applicant: TXC Corporation, Taipei (TW)

(72) Inventors: Erh-Shuo Hsu, Taipei (TW); Wan-Lin Hsieh, Taoyuan (TW)

(73) Assignee: TXC Corporation, Taipel (TW)

( * ) Notice: Subject to any disclaimer, the term of this patent is extended or adjusted under 35 U.S.C. 154(b) by 0 days.

(21) Appl. No.: 17/897,223

(22) Filed: Aug. 29, 2022

(65) Prior Publication Data

US 2024/0072729 A1   Feb. 29, 2024

(51) Int. Cl.
| | | |
|---|---|---|
| H03L 1/04 | (2006.01) | |
| H03B 5/30 | (2006.01) | |
| H03B 5/32 | (2006.01) | |
| H03L 1/02 | (2006.01) | |

(52) U.S. Cl.
CPC ............... *H03B 5/30* (2013.01); *H03L 1/028* (2013.01); *H03L 1/04* (2013.01)

(58) Field of Classification Search
CPC ... H03B 5/04; H03B 5/30; H03B 5/32; H03B 5/326; H03B 5/36–368; H03L 1/02; H03L 1/028; H03L 1/04
USPC ..................................................... 331/68–70
See application file for complete search history.

(56) References Cited

U.S. PATENT DOCUMENTS

| | | | | |
|---|---|---|---|---|
| 6,208,213 B1* | 3/2001 | Anastasyev | .............. | H03H 9/08 331/158 |
| 6,362,700 B1* | 3/2002 | Fry | .......................... | H03L 1/04 331/158 |
| 6,621,361 B1* | 9/2003 | Fry | ........................... | H03L 1/04 331/158 |
| 2003/0197568 A1* | 10/2003 | Satoh | ........................ | H03B 5/36 331/158 |
| 2006/0132251 A1* | 6/2006 | Satoh | ........................ | H03L 1/04 331/158 |
| 2006/0139115 A1* | 6/2006 | Mizumura | .............. | H03L 1/026 331/176 |
| 2008/0055011 A1 | 3/2008 | Kasahara | | |
| 2009/0256641 A1* | 10/2009 | Lee | ........................... | H03L 1/04 331/66 |
| 2010/0085125 A1 | 4/2010 | Ito | | |
| 2015/0180481 A1 | 6/2015 | Isohata | | |
| 2020/0076438 A1 | 3/2020 | Hsieh et al. | | |
| 2022/0037579 A1* | 2/2022 | Matsukawa | ............ | H10N 30/88 |
| 2022/0038055 A1* | 2/2022 | Matsukawa | ............. | H03L 1/027 |

FOREIGN PATENT DOCUMENTS

| | | |
|---|---|---|
| CN | 107911095 | 4/2018 |
| JP | 2011199335 | 10/2011 |

* cited by examiner

*Primary Examiner* — Levi Gannon
(74) *Attorney, Agent, or Firm* — JCIPRNET (57) ABSTRACT

A crystal oscillator and an oscillating device are provided. The crystal oscillator includes a resonator, a low-thermal conductivity glue, an integrated circuit chip, and a heating element. In the resonator, a crystal blank is hermetically encapsulated. The low-thermal conductivity glue wraps the resonator to suppress temperature variation in the resonator. The integrated circuit chip is disposed below the resonator, and the heating element is configured to supply heat to the resonator.

8 Claims, 9 Drawing Sheets

CRYSTAL OSCILLATOR AND OSCILLATING DEVICE

BACKGROUND

Technical Field

The disclosure relates to a crystal oscillator, and particularly relates to a crystal oscillator and an oscillating device with improved temperature stability.

Description of Related Art

Oven controlled crystal oscillator (OCXO) plays an important role in synchronization network applications. With the development of 5G network construction, OCXO application scenarios have also shifted from indoors to outdoors.

However, the harsher application environment brings greater challenges to product stability. Among them, the influence on the stability of the thermostatic oven is more significant and the capability is limited.

SUMMARY

The disclosure provides a crystal oscillator with a low thermal conductivity glue to reduce heat dissipation, and therefore, when the ambient temperature changes, the product can still maintain high stability.

The disclosure provides an oscillating device having the crystal oscillator.

The crystal oscillator of the disclosure includes a resonator, a low-thermal conductivity glue, an integrated circuit chip, and a heating element. In the resonator, a crystal blank is hermetically encapsulated. The low-thermal conductivity glue wraps the resonator to suppress temperature variation in the resonator. The integrated circuit chip is disposed below the resonator, and the heating element is configured to supply heat to the resonator.

In an embodiment of the disclosure, the low-thermal conductivity glue further wraps the heating element.

In an embodiment of the disclosure, the resonator includes a housing portion, a lid portion on the housing portion, and the crystal blank in a housing space formed by the housing portion and the lid portion.

In an embodiment of the disclosure, the heating element is disposed within the housing portion.

In an embodiment of the disclosure, the heating element is disposed on a surface of the housing portion opposite to the housing space.

In an embodiment of the disclosure, the crystal oscillator further includes a carrier for mounting the integrated circuit chip.

In an embodiment of the disclosure, the heating element is disposed on a surface of the carrier toward the resonator.

In an embodiment of the disclosure, the crystal oscillator further includes a support. Two surfaces of support have a first cavity and a second cavity respectively, wherein the resonator is disposed in the first cavity, and the integrated circuit chip is disposed in the second cavity.

In an embodiment of the disclosure, the heating element is disposed within the support between the resonator and the integrated circuit chip.

In an embodiment of the disclosure, the heating element is formed on the integrated circuit chip.

In an embodiment of the disclosure, the integrated circuit chip is configured to control the heating element.

In an embodiment of the disclosure, the crystal oscillator further includes a temperature sensor formed on the integrated circuit chip to detect a temperature of the resonator.

The oscillating device of the disclosure includes a substrate, a cover disposed on the substrate, and fore-going crystal oscillator disposed in an inner space formed by the substrate and the cover.

In another embodiment of the disclosure, the cover is a metal cover.

In another embodiment of the disclosure, the substrate is a printed circuit board (PCB).

Based on the above, since the low-thermal conductive glue is utilized to wrap the resonator, temperature variation in the resonator can be suppressed. Accordingly, it can enlarge the thermal resistance (TR) between the resonator and ambient environment. Moreover, the heating element may be also wrapped by the low-thermal conductive glue, and thus it can minimize the TR between the resonator and the heating element. Since the temperature variation in the resonator is relatively stable, the power consumption can be reduced, and the temperature of the integrated circuit chip may become lower in the case of wrapping the heating element with the low-thermal conductive glue.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure is described below with reference to the drawings, but the disclosure may be implemented in many different forms and is not limited to the description of the embodiments. In the drawings, for clarity, the dimensions and relative dimensions of the various layers and regions may not be drawn to scale.

FIG. 1 schematic a cross-sectional view of an oscillating device containing a crystal oscillator according to a first embodiment of the disclosure.

Figure 1:
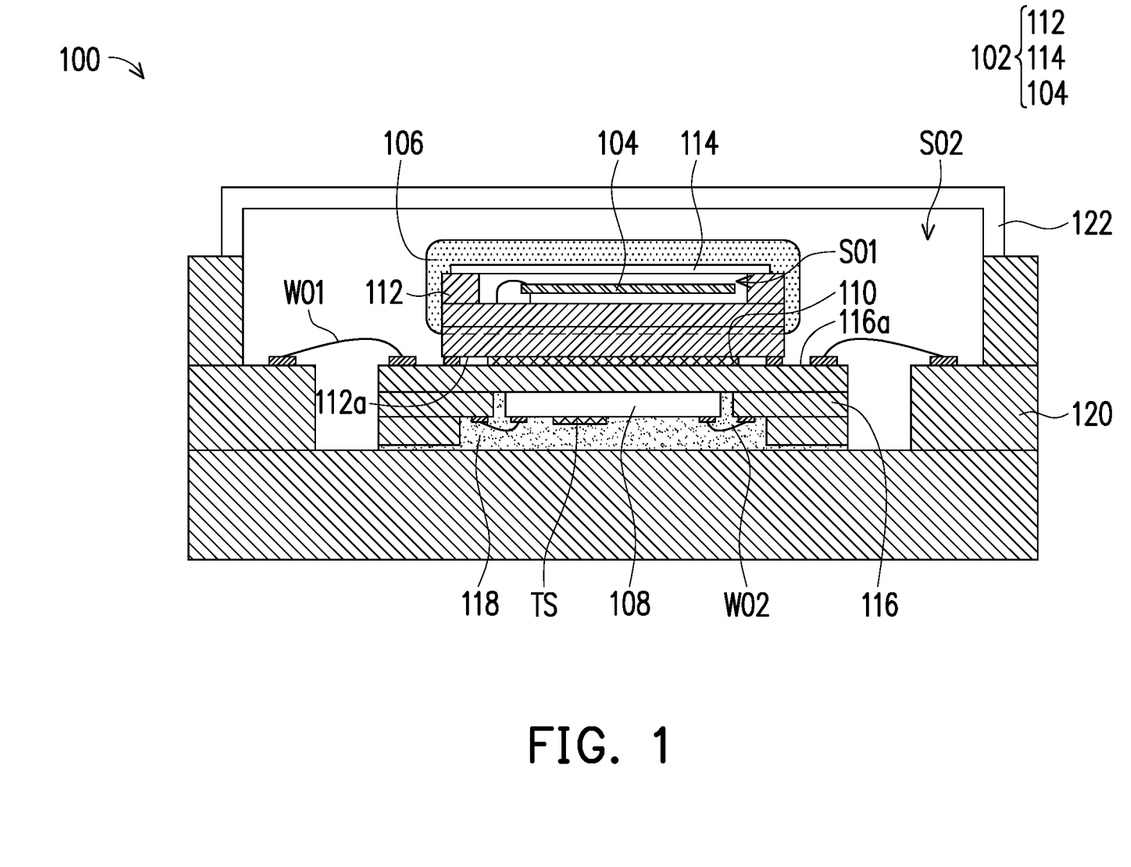
FIG. 1 schematic a cross-sectional view of an oscillating device containing a crystal oscillator according to a first embodiment of the disclosure.

Referring to FIG. 1, the oscillating device 100 includes a substrate 120, a cover 122 disposed on the substrate 120, and a crystal oscillator. The crystal oscillator of the first embodiment includes a resonator 102 including a crystal blank 104, a low-thermal conductivity glue 106, an integrated circuit chip 108, and a heating element 110. In the resonator 102, the crystal blank 104 is hermetically encapsulated, and the resonator 102 may include a housing portion 112, a lid portion 114 on the housing portion 112, and the crystal blank 104 disposed in an housing space S01 formed by the housing portion 112 and the lid portion 114. The low-thermal conductivity glue 106 wraps the resonator 102 to suppress temperature variation in the resonator 102, wherein a thermal conductivity coefficient of the low-thermal conductivity glue 106 is, for example, less than 2 W/mK. Since the low-thermal conductivity glue 106 can prevent heat in the housing space S01 from dissipating out of the resonator 102, the temperature variation in the resonator 102 can be suppressed. Accordingly, it can enlarge the thermal resistance (TR) between the resonator 102 and ambient environment. In the oscillating device 100, the crystal oscillator is disposed in an inner space S02 formed by the substrate 120 and the cover 122, wherein the cover 122 is, for instance, a metal cover.

Based on the thermal resistance (TR) analysis, as the ambient temperature changed from −40° C. to 90° C., the frequency change (ΔF) of the oscillating device 100 with the low-thermal conductivity glue 106 (hereinafter referred to as "Example") is smaller than that of the oscillating device without any low-thermal conductivity glue (hereinafter referred to as "Comparative Example"). Except for the present of the low-thermal conductivity glue 106, the construction of Example is that same as that of Comparative Example. In detail, the frequency change of Example is 15 ppb, and the frequency change of Comparative Example is 43 ppb. If the frequency range of quartz crystal (i.e. crystal blank) is used to convert the (oven) stability, the stability of Example corresponding to ΔF of 15 ppb is about 0.05° C. In comparison, the stability of Comparative Example corresponding to ΔF of 43 ppb is about 0.7° C. Therefore, it has been experimentally demonstrated that the crystal oscillator according to the disclosure has improved oven stability.

Referring to FIG. 1 again, the integrated circuit chip 108 is disposed below the resonator 102, and the integrated circuit chip 108 may be configured to control the heating element 110. The heating element 110 is configured to supply heat to the resonator 102. In the first embodiment, the heating element 110 is disposed on a surface 112a of the housing portion 112 opposite to the housing space S01, and the crystal oscillator further includes a carrier 116 for mounting the integrated circuit chip 108. In another embodiment, the heating element 110 may be disposed on a surface 116a of a carrier 116 toward the resonator 102. In the first embodiment, the crystal oscillator is wire bound by bond wires W01 to the substrate 120, but the disclosure is not limited hereto. The crystal oscillator may further include a temperature sensor TS formed on the integrated circuit chip 108 to detect a temperature of the resonator 102, and the integrated circuit chip 108 may control the heating element 110 based on information from the temperature sensor TS. In one embodiment, the temperature sensor TS includes, for instance, an on-chip temperature sensor. The integrated circuit chip 108 may be wire bound by bond wires W02 to the carrier 116, and a molding compound 118 may encapsulate the integrated circuit chip 108 and the temperature sensor TS. However, the disclosure is not limited hereto, and other embodiments will be described as follows.

Figure 2:
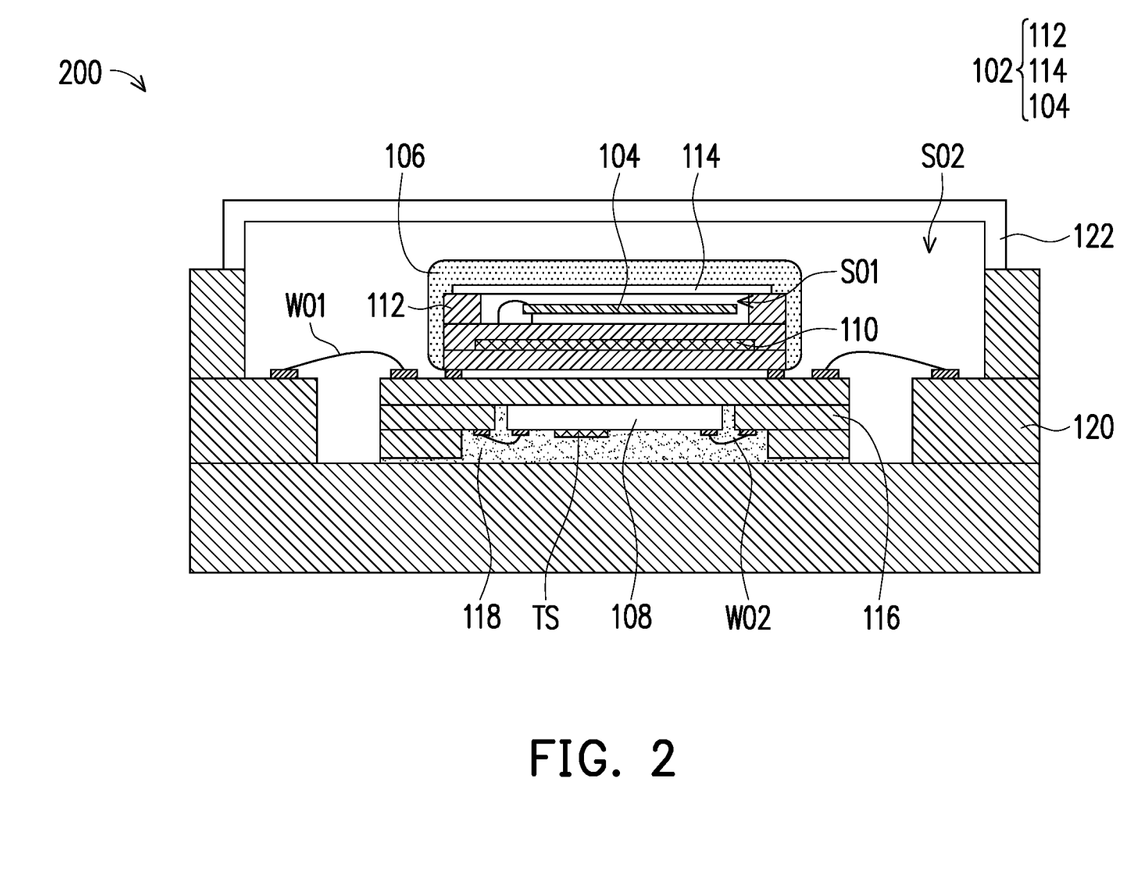
FIG. 2 schematic a cross-sectional view of an oscillating device containing a crystal oscillator according to a second embodiment of the disclosure.

FIG. 2 schematic a cross-sectional view of an oscillating device containing a crystal oscillator according to a second embodiment of the disclosure, wherein the reference symbols used in the first embodiment are used to equally represent the same or similar components.

Referring to FIG. 2, the difference between the second embodiment and the first embodiment is that, in the oscillating device 200, the low-thermal conductivity glue 106 further wraps the heating element 110 and the position of the heating element 110. In the second embodiment, the heating element 110 is disposed within the housing portion 112, wherein the housing portion 112 may be a multi-layer structure such a three-layer structure, and the heating element 110 may be disposed between two layers of the three-layer structure. Since the low-thermal conductivity glue 106 wraps the heating element 110, it can minimize the thermal resistance (TR) between the resonator 102 and the heating element 110.

Figure 3:
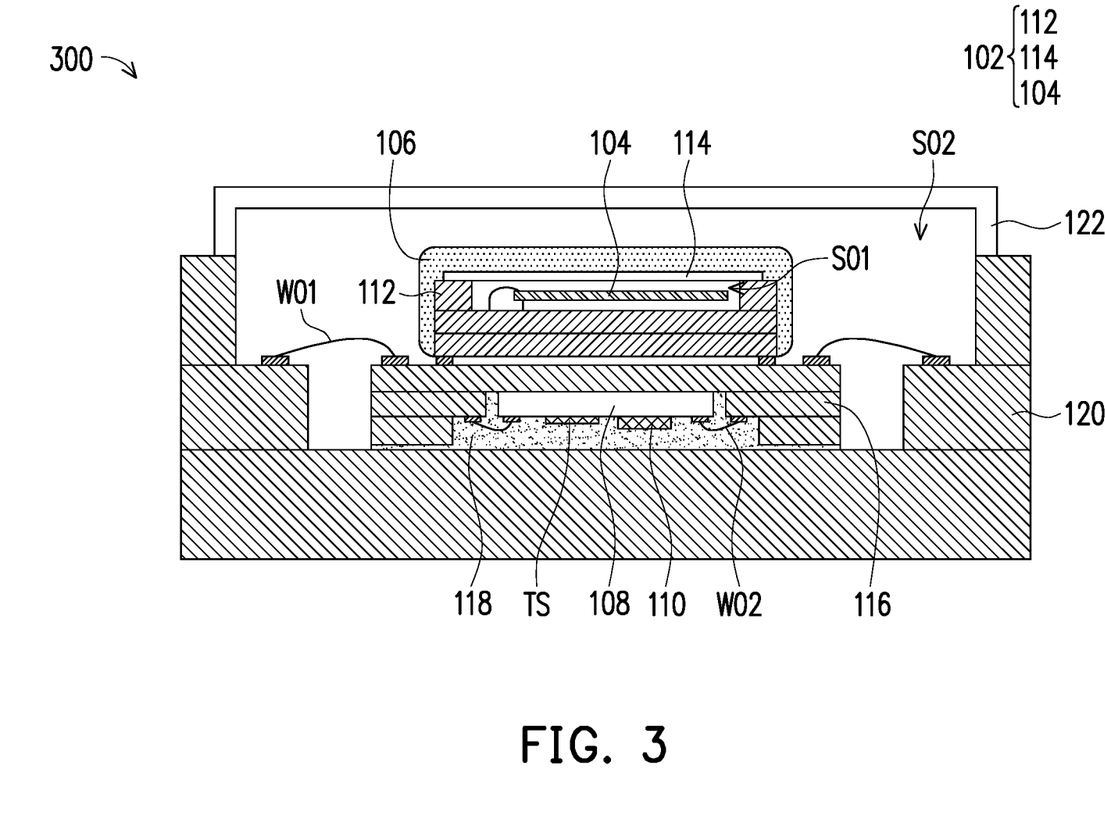
FIG. 3 schematic a cross-sectional view of an oscillating device containing a crystal oscillator according to a third embodiment of the disclosure.

FIG. 3 schematic a cross-sectional view of an oscillating device containing a crystal oscillator according to a third embodiment of the disclosure, wherein the reference symbols used in the first embodiment are used to equally represent the same or similar components.

Referring to FIG. 3, the difference between the third embodiment and the first embodiment is that, in the oscillating device 300, the heating element 110 is formed on the integrated circuit chip 108. Accordingly, the heating element 110 can be integrated with the integrated circuit chip 108 and the temperature sensor TS, wherein the heating element 110 is, for instance, a resistive heater or other suitable element.

Figure 4:
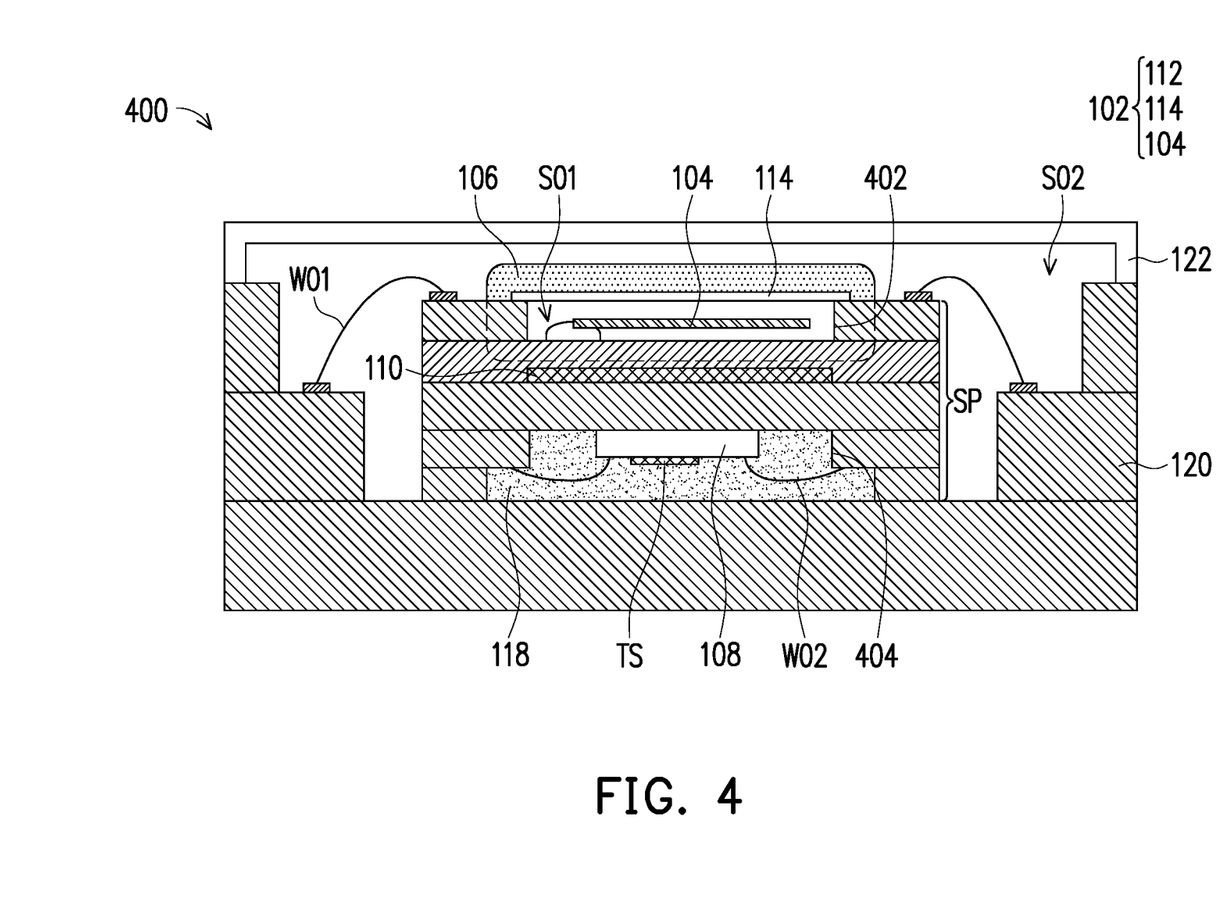
FIG. 4 schematic a cross-sectional view of an oscillating device containing a crystal oscillator according to a fourth embodiment of the disclosure.

FIG. 4 schematic a cross-sectional view of an oscillating device containing a crystal oscillator according to a fourth embodiment of the disclosure, wherein the reference symbols used in the first embodiment are used to equally represent the same or similar components.

Referring to FIG. 4, the difference between the fourth embodiment and the first embodiment is that, in the oscillating device 400, the crystal oscillator includes a support SP. Two surfaces of the support SP have a first cavity 402 and a second cavity 404 respectively, wherein the crystal blank 104 of the resonator 102 is disposed in the first cavity 402, and the integrated circuit chip 108 is disposed in the second cavity 404. Accordingly, the support SP is so-called "H type package." The low-thermal conductivity glue 106 wraps the resonator 102 to suppress temperature variation in the resonator 102, and the heating element 110 is disposed within the support SP between the resonator 102 and the integrated circuit chip 108. In the fourth embodiment, the support SP may be a multi-layer structure such a five-layer structure, and the heating element 110 may be disposed between two layers of the five-layer structure.

Figure 5:
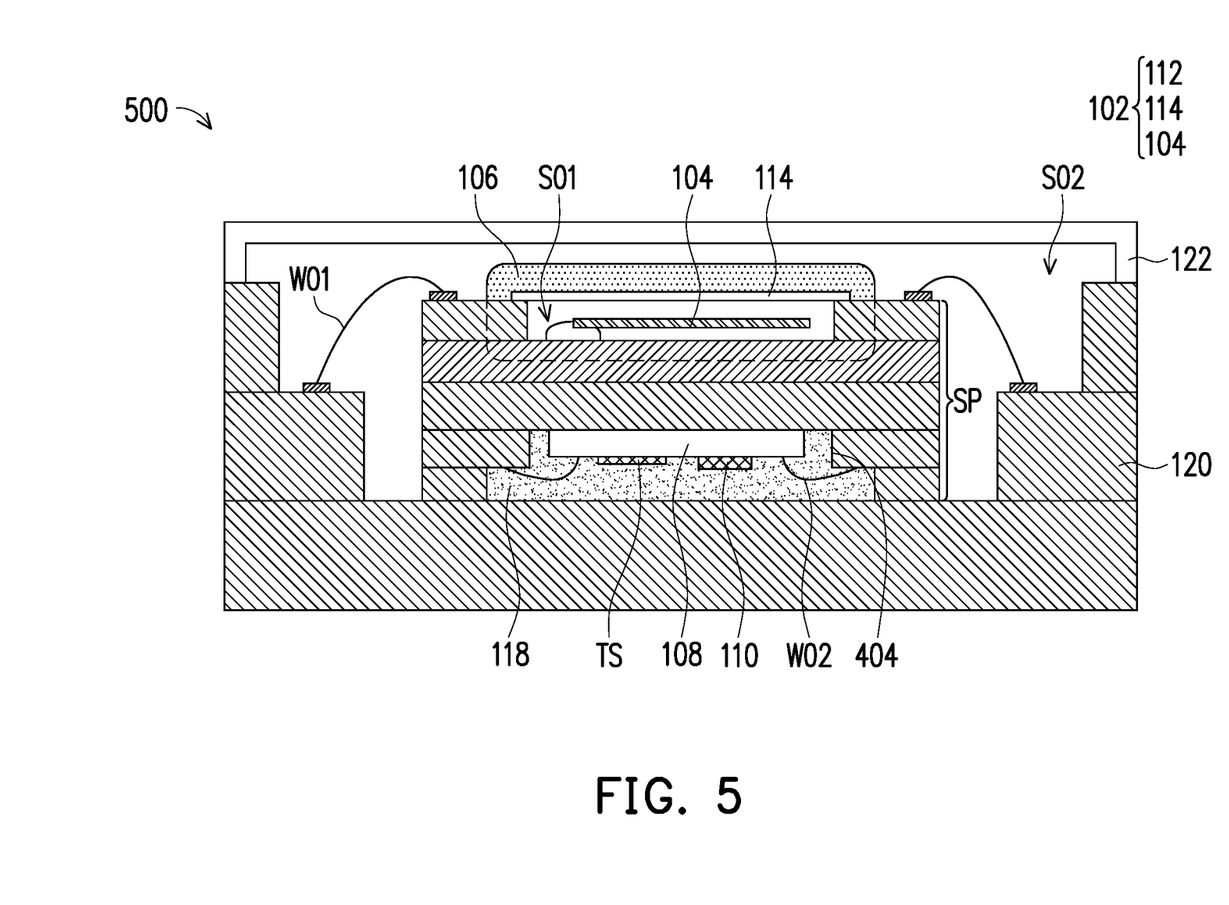
FIG. 5 schematic a cross-sectional view of an oscillating device containing a crystal oscillator according to a fifth embodiment of the disclosure.

FIG. 5 schematic a cross-sectional view of an oscillating device containing a crystal oscillator according to a fifth embodiment of the disclosure, wherein the reference symbols used in the fourth embodiment are used to equally represent the same or similar components.

Referring to FIG. 5, the difference between the fifth embodiment and the fourth embodiment is that, in the oscillating device 500, the heating element 110 is formed on the integrated circuit chip 108. Accordingly, the heating element 110 can be integrated with the integrated circuit chip 108 and the temperature sensor TS.

Figure 6:
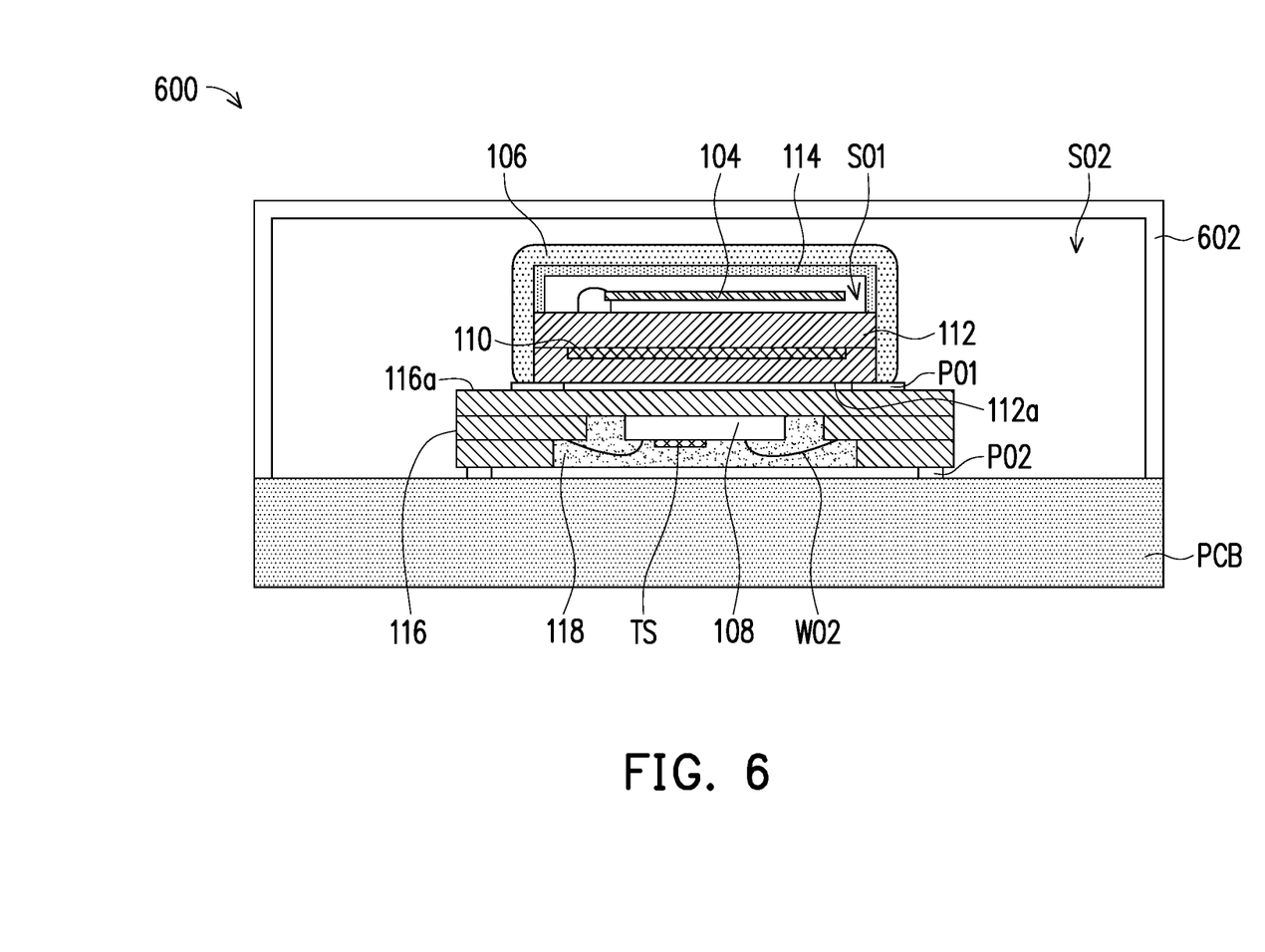
FIG. 6 schematic a cross-sectional view of an oscillating device containing a crystal oscillator according to a sixth embodiment of the disclosure.

FIG. 6 schematic a cross-sectional view of an oscillating device containing a crystal oscillator according to a sixth embodiment of the disclosure, wherein the reference symbols used in the first embodiment are used to equally represent the same or similar components.

Referring to FIG. 6, the difference between the sixth embodiment and the first embodiment is that, in the oscillating device 600, the substrate is a printed circuit board (PCB), and the cover 602 is installed on the substrate PCB. The heating element 110 is disposed within the housing portion 112, and the low-thermal conductivity glue 106 further wraps the heating element 110. In the sixth embodiment, first pads P01 may be utilized to connect the housing portion 112 and the carrier 116, and second pads P02 may be utilized to connect the carrier 116 and the substrate PCB for connections therebetween. In other words, the bond wires W01 in the first embodiment can be replace by the second pads P02.

Figure 7:
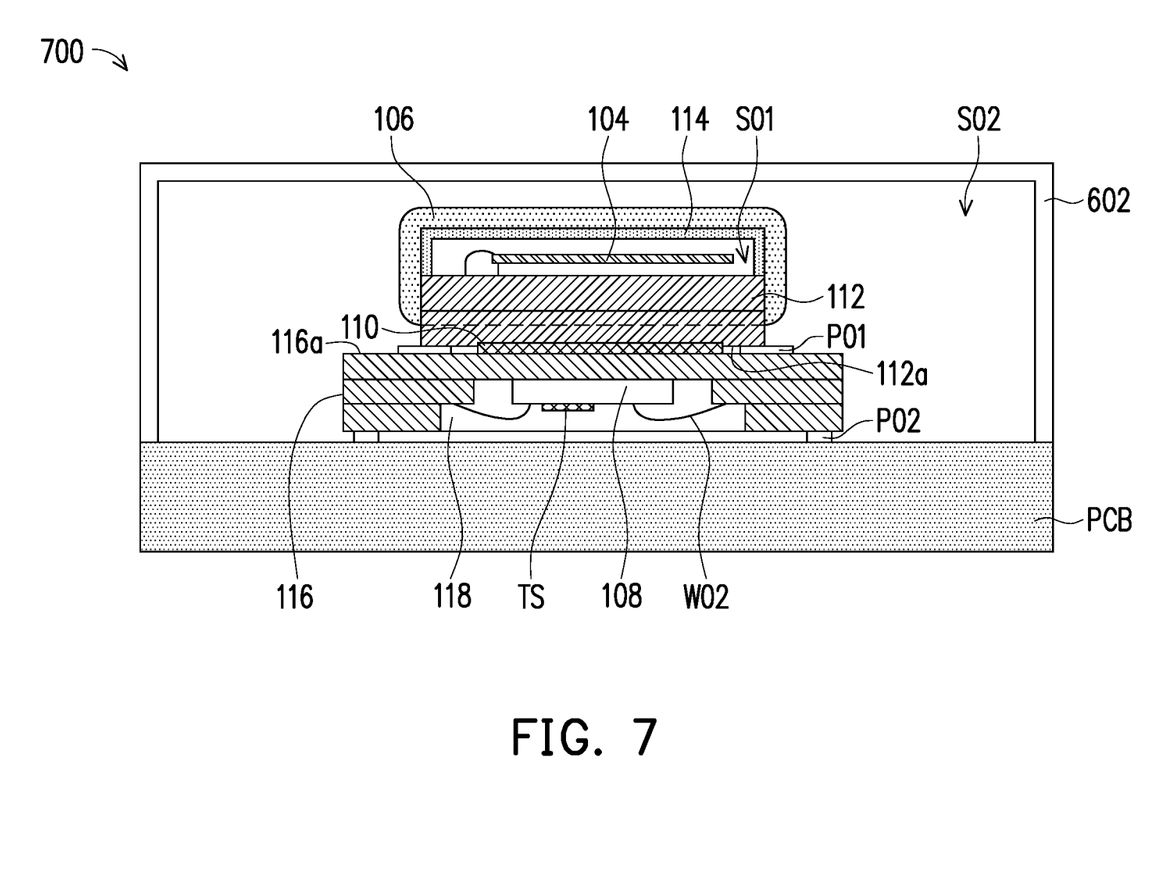
FIG. 7 schematic a cross-sectional view of an oscillating device containing a crystal oscillator according to a seventh embodiment of the disclosure.

FIG. 7 schematic a cross-sectional view of an oscillating device containing a crystal oscillator according to a seventh embodiment of the disclosure, wherein the reference symbols used in the sixth embodiment are used to equally represent the same or similar components.

Referring to FIG. 7, the difference between the seventh embodiment and the sixth embodiment is that, in the oscillating device 700, the heating element 110 is disposed on a surface 116a of the carrier 116, and the low-thermal conductivity glue 106 doesn't wrap the heating element 110.

Figure 8:
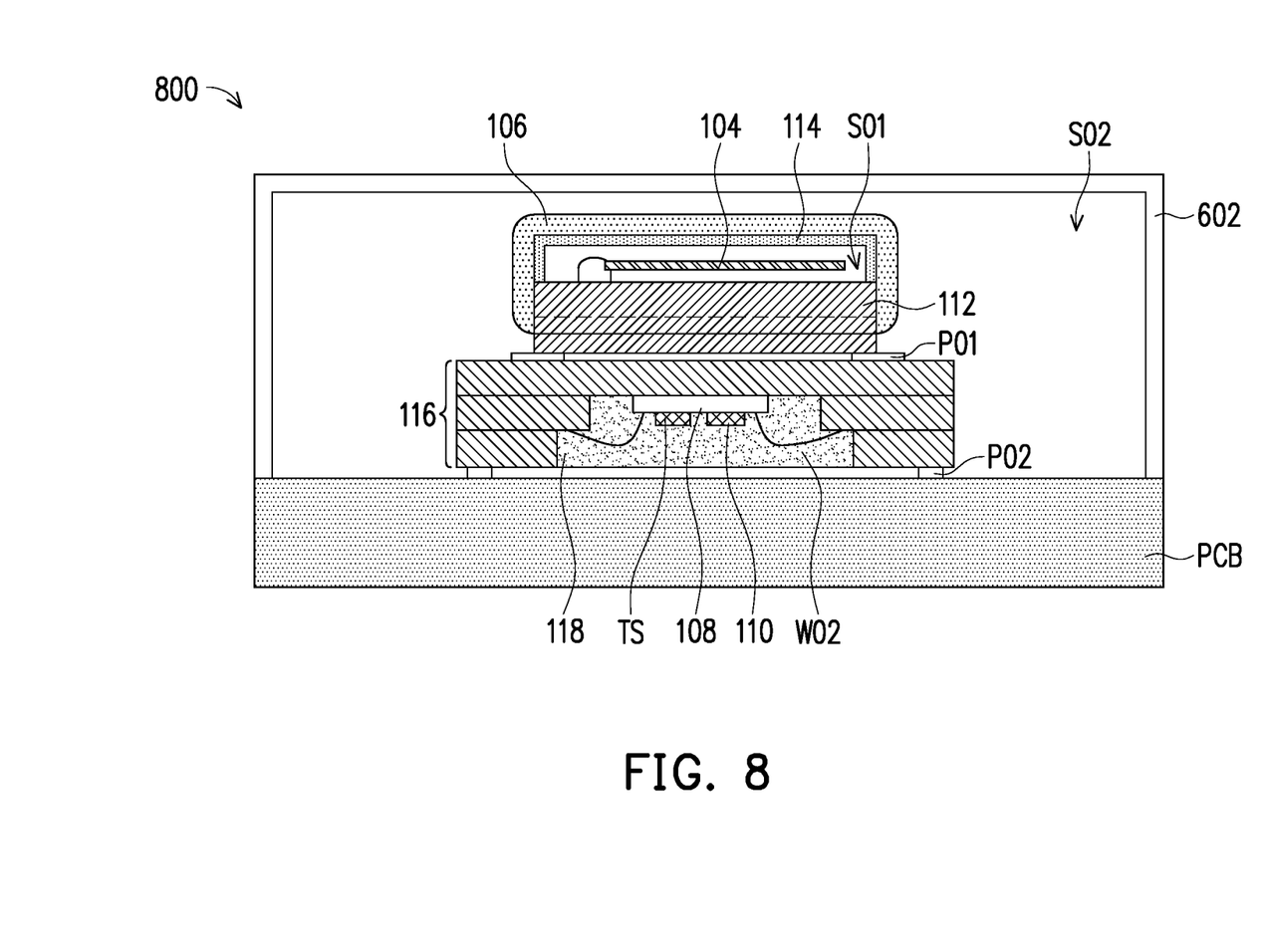
FIG. 8 schematic a cross-sectional view of an oscillating device containing a crystal oscillator according to an eighth embodiment of the disclosure.

FIG. 8 schematic a cross-sectional view of an oscillating device containing a crystal oscillator according to an eighth embodiment of the disclosure, wherein the reference symbols used in the sixth embodiment are used to equally represent the same or similar components.

Referring to FIG. 8, the difference between the eighth embodiment and the sixth embodiment is that, in the oscillating device 800, the heating element 110 is formed on the integrated circuit chip 108. Accordingly, the heating element 110 can be integrated with the integrated circuit chip 108 and the temperature sensor TS.

Figure 9:
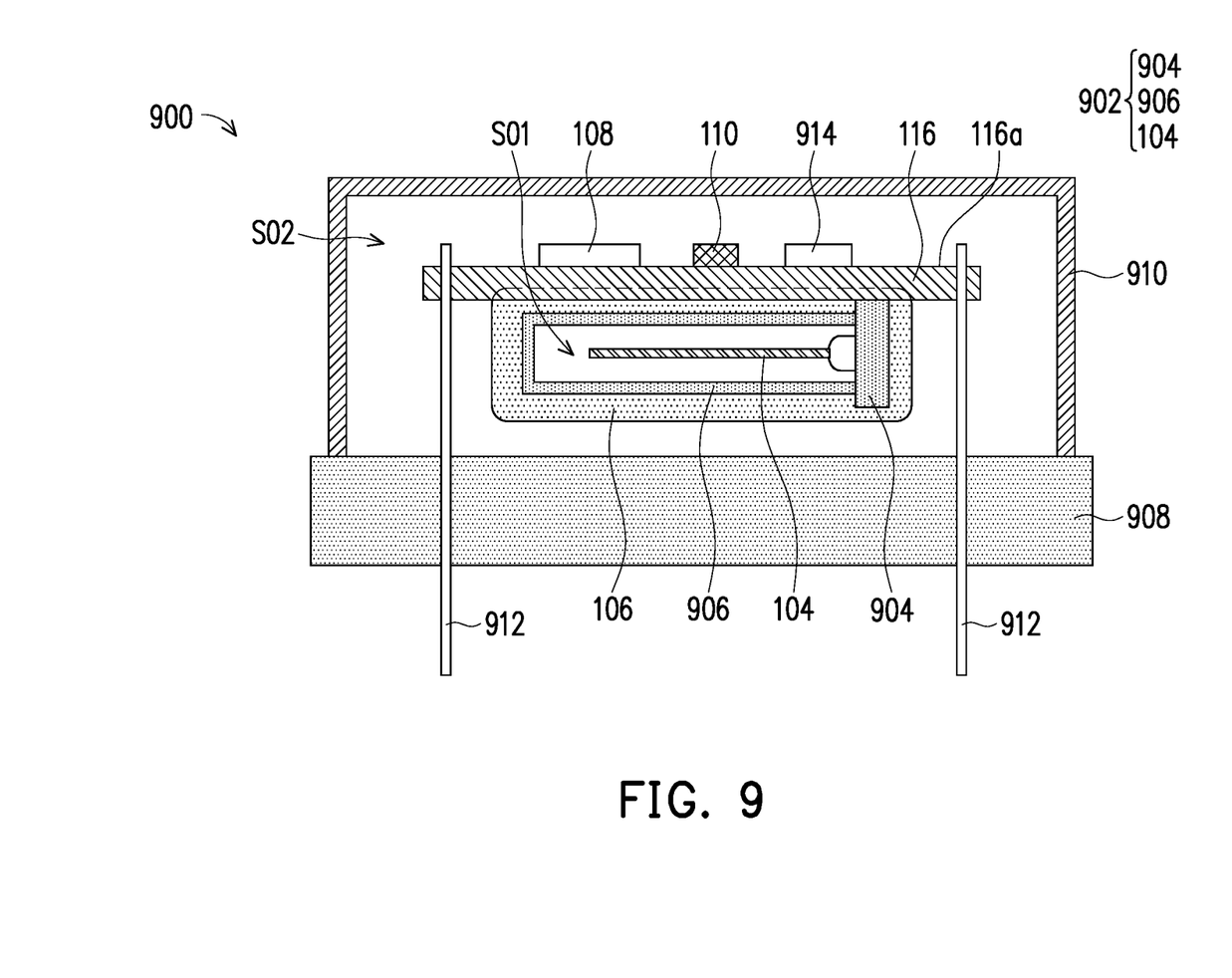
FIG. 9 schematic a cross-sectional view of an oscillating device containing a crystal oscillator according to a ninth embodiment of the disclosure.

FIG. 9 schematic a cross-sectional view of an oscillating device containing a crystal oscillator according to a ninth embodiment of the disclosure, wherein the reference symbols used in the first embodiment are used to equally represent the same or similar components.

Referring to FIG. 9, the crystal oscillator includes a resonator 902 with a crystal blank 104, a low-thermal conductivity glue 106, an integrated circuit chip 108, and a heating element 110. In the resonator 902, the crystal blank 104 is hermetically encapsulated. The resonator 902 includes a housing portion 906, a lid portion 904 on the housing portion 906, and the crystal blank 104 in a housing space S01 formed by the housing portion 906 and the lid portion 904. In this embodiment, the lid portion 904 is such as a base connected on the carrier 116, and the housing portion 906 may be a metal cover. The low-thermal conductivity glue 106 wraps the resonator 902 to suppress temperature variation in the resonator 902. The integrated circuit chip 108 is disposed over the resonator 902, and the heating element 110 is configured to supply heat to the resonator 902. The heating element 110 is disposed on a surface 116a of the carrier 116 opposite to the housing space S01, and the integrated circuit chip 118 is mounted on the carrier 116.

In FIG. 9, the oscillating device 900 includes a substrate 908, a cover 910 disposed on the substrate 908, and the crystal oscillator (e.g. the resonator 902, the low-thermal conductivity glue 106, then integrated circuit chip 108, and the heating element 110) disposed in an inner space S02 formed by the substrate 908 and the cover 910, wherein the cover 910 is, for example, a metal cover. The carrier 116 may be held with lead wires 912 as airtight terminals. In addition, a control element 914 may be integrated on the surface 116a of the carrier 116 for performing other functions in the oscillating device 900.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A crystal oscillator, comprising:
   a resonator comprising a housing portion and a lid portion on the housing portion, wherein a crystal blank is hermetically encapsulated in a housing space formed by the housing portion and the lid portion;
   a low-thermal conductivity glue wrapping the resonator to suppress temperature variation in the resonator;
   an integrated circuit chip disposed below the resonator; and
   a heating element configured to supply heat to the resonator and positioned on a surface of the housing portion opposite to the housing space outside the low-thermal conductivity glue.

2. The crystal oscillator of claim 1, further comprising a carrier for mounting the integrated circuit chip.

3. The crystal oscillator of claim 2, wherein the heating element is disposed on a surface of the carrier toward the resonator.

4. The crystal oscillator of claim 1, wherein the integrated circuit chip is configured to control the heating element.

5. The crystal oscillator of claim 1, further comprising a temperature sensor formed on the integrated circuit chip to detect a temperature of the resonator.

6. An oscillating device, comprising:
   a substrate;
   a cover disposed on the substrate; and
   the crystal oscillator of claim 1 disposed in an inner space formed by the substrate and the cover.

7. The oscillating device of claim 6, wherein the cover comprises a metal cover.

8. The oscillating device of claim 6, wherein the substrate comprises a printed circuit board (PCB).

* * * * *